United States Patent
Yu et al.

(10) Patent No.: US 9,628,120 B2
(45) Date of Patent: *Apr. 18, 2017

(54) ADAPTIVELY CONTROLLED PRE-DISTORTION CIRCUITS FOR RF POWER AMPLIFIERS

(71) Applicant: Scintera Networks LLC, Wilmington, DE (US)

(72) Inventors: Qian Yu, Santa Clara, CA (US); Yan Wang, Sunnyvale, CA (US); Rajeev Krishnamoorthy, Saratoga, CA (US)

(73) Assignee: Scintera Networks LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/961,295

(22) Filed: Dec. 7, 2015

(65) Prior Publication Data
US 2016/0087657 A1     Mar. 24, 2016

Related U.S. Application Data

(63) Continuation of application No. 14/166,422, filed on Jan. 28, 2014, now Pat. No. 9,209,841.

(51) Int. Cl.
*H04B 1/62* (2006.01)
*H04B 1/04* (2006.01)

(52) U.S. Cl.
CPC ..... *H04B 1/0475* (2013.01); *H04B 2001/045* (2013.01); *H04B 2001/0425* (2013.01); *H04B 2001/0441* (2013.01)

(58) Field of Classification Search
CPC .... H03F 1/3241; H03F 1/3247; H03F 1/3258; H03F 1/0266; H03F 1/0394; H03F 2201/3221; H03F 2201/3227; H03F 2201/3231; H03F 2201/3233; H03F 2201/3224; H03F 2201/3212; H04L 25/03343; H04B 2001/0408; H04B 2001/0425; H04B 2001/0433; H04B 2001/045; H04B 1/0475
USPC .......................................... 375/295, 296, 297
See application file for complete search history.

(56) References Cited

U.S. PATENT DOCUMENTS

| 7,095,798 | B2 |  | 8/2006 | Hunton |  |
|---|---|---|---|---|---|
| 7,170,952 | B2 |  | 1/2007 | Hunton |  |
| 7,313,373 | B1 | * | 12/2007 | Laskharian | H04B 1/04 455/127.1 |
| 7,729,446 | B2 | * | 6/2010 | Copeland | H03F 1/3247 330/149 |
| 8,295,394 | B1 |  | 10/2012 | Broadwell et al. |  |
| 8,446,979 | B1 | * | 5/2013 | Yee | H04L 27/368 375/219 |

(Continued)

OTHER PUBLICATIONS

U.S. Appl. No. 13/897,119, filed May 17, 2013, Yu et al.
U.S. Appl. No. 14/166,422, filed Jan. 28, 2014, Yu et al.

*Primary Examiner* — Siu Lee

(57) ABSTRACT

A system includes a crest-factor reduction circuit, a signal analyzer, and a pre-distortion circuit. The crest-factor reduction circuit reduces a crest factor of a baseband signal and generates a feedforward signal. The signal analyzer generates parameters based on the feedforward signal and an output signal from a power amplifier. The pre-distortion circuit generates a pre-distorted baseband signal based on the parameters for input to the power amplifier.

22 Claims, 11 Drawing Sheets

(56) References Cited

U.S. PATENT DOCUMENTS

| | | | |
|---|---|---|---|
| 8,526,537 B2* | 9/2013 | Chen | H03F 1/3247 |
| | | | 375/297 |
| 8,649,746 B2* | 2/2014 | Kang | H04B 1/0028 |
| | | | 330/149 |
| 8,937,993 B2 | 1/2015 | Yu et al. | |
| 8,971,464 B2* | 3/2015 | Gandhi | H04B 1/0475 |
| | | | 370/331 |
| 9,209,841 B2* | 12/2015 | Yu | H04B 1/0475 |
| 2002/0197970 A1 | 12/2002 | Jian et al. | |
| 2004/0234006 A1 | 11/2004 | Leung | |
| 2008/0130789 A1 | 6/2008 | Copeland et al. | |
| 2008/0144539 A1 | 6/2008 | Sperlich et al. | |
| 2010/0029239 A1 | 2/2010 | Asuri | |
| 2012/0106676 A1* | 5/2012 | McCallister | H03F 1/0266 |
| | | | 375/297 |
| 2012/0320948 A1 | 12/2012 | McGowan et al. | |
| 2012/0328050 A1 | 12/2012 | Bai et al. | |
| 2013/0022148 A1 | 1/2013 | Sagi et al. | |
| 2013/0089169 A1 | 4/2013 | Batruni | |
| 2014/0029683 A1 | 1/2014 | Morris et al. | |
| 2014/0317163 A1 | 10/2014 | Azadet et al. | |
| 2014/0341316 A1 | 11/2014 | Yu et al. | |
| 2015/0049841 A1 | 2/2015 | Laporte et al. | |
| 2015/0103952 A1 | 4/2015 | Wang et al. | |
| 2015/0214987 A1 | 7/2015 | Yu et al. | |

\* cited by examiner

ADAPTIVELY CONTROLLED PRE-DISTORTION CIRCUITS FOR RF POWER AMPLIFIERS

CROSS REFERENCE TO RELATED APPLICATIONS

The present disclosure is a continuation of U.S. patent application Ser. No. 14/166,422 filed on Jan. 28, 2014. The entire disclosure of the application referenced above is incorporated herein by reference.

The present disclosure relates to U.S. patent application Ser. No. 13/897,119, entitled "Crest Factor Reduction for Band-Limited Multi-Carrier Signals," filed on May 17, 2013, now U.S. Pat. No. 8,937,993. The entire disclosure of the application referenced above is incorporated herein by reference.

BACKGROUND

1. Field of the Invention

The present invention relates to signal pre-distortion techniques in power amplifiers. In particular, the present invention relates to signal pre-distortion techniques used in conjunction with an integrated signal analyzer.

2. Discussion of the Related Art

Adaptive digital pre-distortion (DPD) is a technique widely used in the macro-cell base stations of "third-generation" (3G) wireless communication systems. In a 3G macro-cell base station, a power amplifier typically has 42~48 dBm output power. In contrast, in "fourth generation" (4G) wireless communication systems, and beyond, small-cell base stations are often expected, in which a typical power amplifier has 27~35 dBm output power. Because the output power of amplifiers in such a small-cell base station is 10~20 dB lower than macro-cell base stations of a 3G base station, it is desirable to reduce the power consumption of a pre-distortion circuit in a 4G small-cell base station by 10~20 dB, so as to maintain overall power efficiency. In addition, it is also desirable to reduce the cost of the pre-distortion circuit by 10%, which amounts to approximately 1% of the cost in a typical budget for a macro-cell base station.

In the prior art, adaptive digital pre-distortion techniques use expensive high-speed and high-precision analog-to-digital converters (ADCs) to acquire accurate waveforms of the output signals of a power amplifier (PA). As the non-linearity of a PA enhances the PA's output bandwidth and as an intermediate-frequency down-conversion is required for eliminating I/Q imbalance, the ADC's sampling rate in such adaptive digital pre-distortion application is typically 10 or more times the original RF bandwidth, typically between 200 to 1000 mega-samples (MS) per second for RF signals with 20~100 MHz bandwidth (e.g. 240 MS/s for a 4-carrier WCDMA signal). In addition, to detect an out-of-band emission as low as −60 dBc, the ADC needs an effective number of bits (ENOB) of approximately 11. As a result, the prior art uses dedicated, stand-alone ADC integrated circuits with ENOB greater than 10 at 200~1000 MS/s. However, such high-precision and high-speed ADC integrated circuits are expensive and power-consuming.

In addition to the high-speed, high-precision dedicated ADC integrated circuits having high power requirements, the signal processing algorithms that are carried out in conjunction with the ADC are also very computationally complex and intensive. Consequently, fast, power-consuming digital signal processors (DSP) are required. Such DPD circuits are too costly and require too much power to be suitable for use in a small-cell base station.

Prior art analog RF pre-distortion methods can be low-power and low-cost. However, existing analog RF pre-distortion circuits are not easily adaptable for use in small-cell base station applications for two reasons. First, the adjacent channel leakage ratio (ACLR) performance is limited by analog signal processing. Second, for small-cell base station application, the task may require integrating an analog pre-distortion circuit, which is typically designed for an older CMOS process (e.g. 0.18-μm CMOS) onto a transceiver integrated circuit that is typically designed for a newer CMOS process (e.g. 65-nm CMOS).

SUMMARY

The present invention shows a low-power, low-cost, adaptive digital pre-distortion (DPD) for linearizing power amplifiers in small-cell base stations. The present invention does not require use of high-speed, high-precision ADCs.

According to one embodiment of the present invention, a pre-distortion circuit for a power amplifier may include:
 (a) a digital interface for receiving a complex-value digital baseband signal;
 (b) a mixed-signal pre-distortion circuit adaptively controlled by a set of parameter values, receiving the complex-value digital baseband signal to provide a pre-distorted signal for input to the power amplifier, the mixed-signal pre-distortion circuit may include:
  (i) a digital pre-distortion circuit that transforms the complex-value digital baseband signal to a pre-distorted complex-value digital baseband signal by applying to the complex-value digital baseband signal a memory-less non-linear gain and a polynomial function based on the complex-value digital baseband signal and one or more delayed copies of the complex-value digital baseband signal; and
  (ii) an up-converter that converts the pre-distorted complex-value digital baseband signal to the pre-distorted signal; and
 (c) a signal analyzer receiving an output signal from the power amplifier to provide the parameter values from time to time to the mixed-signal pre-distortion circuit.

In one embodiment, the polynomial function may be composed of one or more powers of the moduli of the complex-value digital baseband signal and one or more powers of the moduli of the delayed copies of the complex-value digital baseband signal, and the memory-less non-linear gain is applied after a unit delay to the complex-value digital baseband signal. In addition, the memory-less non-linear gain may be a polynomial function of the complex value digital baseband signal.

In one embodiment, the digital pre-distortion circuit uses look-up tables to compute either one or both of the memory-less non-linear gain and the polynomial function.

The digital pre-distortion circuit may include an over-sampler that increases the data rate in the complex-value digital baseband signal by at least a factor of 2.

The signal analyzer may include (a) a quadrature down-converter that converts the output signal from the power amplifier to a complex-value feedback signal that is at baseband or at a near-baseband intermediate frequency; (b) an analog-to-digital converter that converts the complex-value feedback signal to a first digital complex-value feedback signal; and (c) a digital signal analysis circuit that receives the digital complex-value feedback signal to provide the parameter values. The up-converter and the quadrature down-converter operate from a common timing signal. The digital pre-distortion circuit and the signal analyzer may be implemented using one or more digital signal processors. The memory-less non-linear gain is computed based on a magnitude of first digital complex-value feedback signal.

According to one embodiment of the present invention, the signal analyzer may receive in addition to the pre-distorted signal. In that embodiment, the signal analyzer may further include (a) a second quadrature down-converter that converts the pre-distorted signal to a second complex-value feedback signal that is at baseband or at the near-baseband intermediate frequency; and (b) an analog-to-digital converter that converts the second complex-value feedback signal to a second digital complex-value feedback signal. The digital signal analysis circuit in that case provides the parameter values based on both the first digital complex-value feedback signal and the second digital complex-value feedback signal. The digital signal analysis circuit may perform one or more of DC offset correction, I/Q imbalance correction and delay matching on either or both of the first digital complex-value feedback signal and the second digital complex-value feedback signal. The digital signal analysis may also perform linear distortion correction on the first complex-value feedback signal. The digital signal analysis circuit may compute the parameter values based on minimizing a difference between the first complex-value feedback signal and the second complex-value feedback signal.

According to one embodiment of the present invention, the pre-distortion circuit may also include a crest-factor reduction circuit that reduces a crest factor in the complex-value digital baseband signal provided to the mixed-signal pre-distortion circuit. The signal analyzer may receive also a complex-value feed-forward signal representative of the complex-value digital baseband signal, which may be the crest factor-reduced complex-value digital baseband signal. In one of these embodiments, the signal analyzer may include (a) a quadrature down-converter that converts the output signal from the power amplifier to a complex-value feedback signal that is at baseband or at a near-baseband intermediate frequency; (b) an analog-to-digital converter that converts the complex-value feedback signal to a first digital complex-value feedback signal; and (c) a digital signal analysis circuit that receives the digital complex-value feedback signal to provide the parameter values. The up-converter and the quadrature down-converter operate from a common timing signal. The digital signal analysis circuit may provide the parameter values based on both the first digital complex-value feedback signal and the complex-value feed-forward signal. The digital signal analysis circuit may perform one or more of I/Q balance correction, delay matching, complex gain adjustments, frequency offset correction and DC offset correction on the complex-value feed-forward signal. The digital signal analysis circuit may compute the parameter values based on minimizing a difference between the first complex-value feedback signal and the complex-value feed-forward signal. The digital signal analysis may perform frequency offset correction on the complex-value feed-forward signal.

According to one embodiment of the present invention, the pre-distortion circuit may include an analog-to-digital converter enhancer circuit that receives from the digital signal analysis circuit a data signal representing one or more clock periods of the complex value feed-forward signal. The analog-to-digital converter enhancer circuit may apply a current-steering digital-to-analog technique. The analog-to-digital converter enhancer circuit may include (a) a digital-to-analog circuit that converts the data signal to a complex data current; and (b) a current combination circuit that provides an output current representative of a difference between the complex data current and the complex-value feedback signal. The analog-to-digital converter enhancer circuit may further include a resistor element that converts the output current into an output voltage. The analog-to-digital converter enhancer circuit may further include a second stage that receives the output voltage and a second data signal from the digital signal analysis circuit, the second stage applies a charge-redistribution technique. The second stage may include (a) cascaded first and second tracking-and-hold circuits operated by complementary clock signals to provide held voltage signal; (b) a digital-to-analog converter that converts to second data signal to provide an voltage data signal; and (c) a voltage summer that provides a second-stage output signal representative of a voltage difference between the held voltage signal and the voltage data signal.

According to one embodiment of the present invention, the mixed signal pre-distortion circuit in the pre-distortion circuit may be integrated into a transceiver integrated circuit, while the signal analyzer circuit is integrated into an integrated circuit separate from the transceiver integrated circuit. Alternatively, the digital pre-distortion circuit and the digital signal analysis circuit may be integrated into a mixed-signal integrated circuit, while the up-converter is integrated into an integrated circuit separate from the mixed-signal integrated circuit.

According to one embodiment of the present invention, a signal analyzer may be provided that has a frequency synthesizer, a quadrature down-converter, ADCs, and other digital circuits integrated on a CMOS integrated circuit that can be fabricated by a standard mixed-signal CMOS process. Consequently, the present invention greatly reduces the requirement on analog-to-digital conversion speed and precision in the ADCs of the signal analyze, thereby obviating a need for costly, stand-alone ADC integrated circuits. In conjunction the signal analyzer, the present invention provides pre-distortion and adaptation algorithms that achieve low power operations.

The present invention is better understood upon consideration of the detailed description below, in conjunction with the accompanying drawings.

BRIEF DESCRIPTION OF THE DRAWINGS

To simplify the detailed description below and to allow cross-reference among the figures, like elements are assigned like reference numerals.

DETAILED DESCRIPTION OF THE PREFERRED EMBODIMENTS

Figure 1:
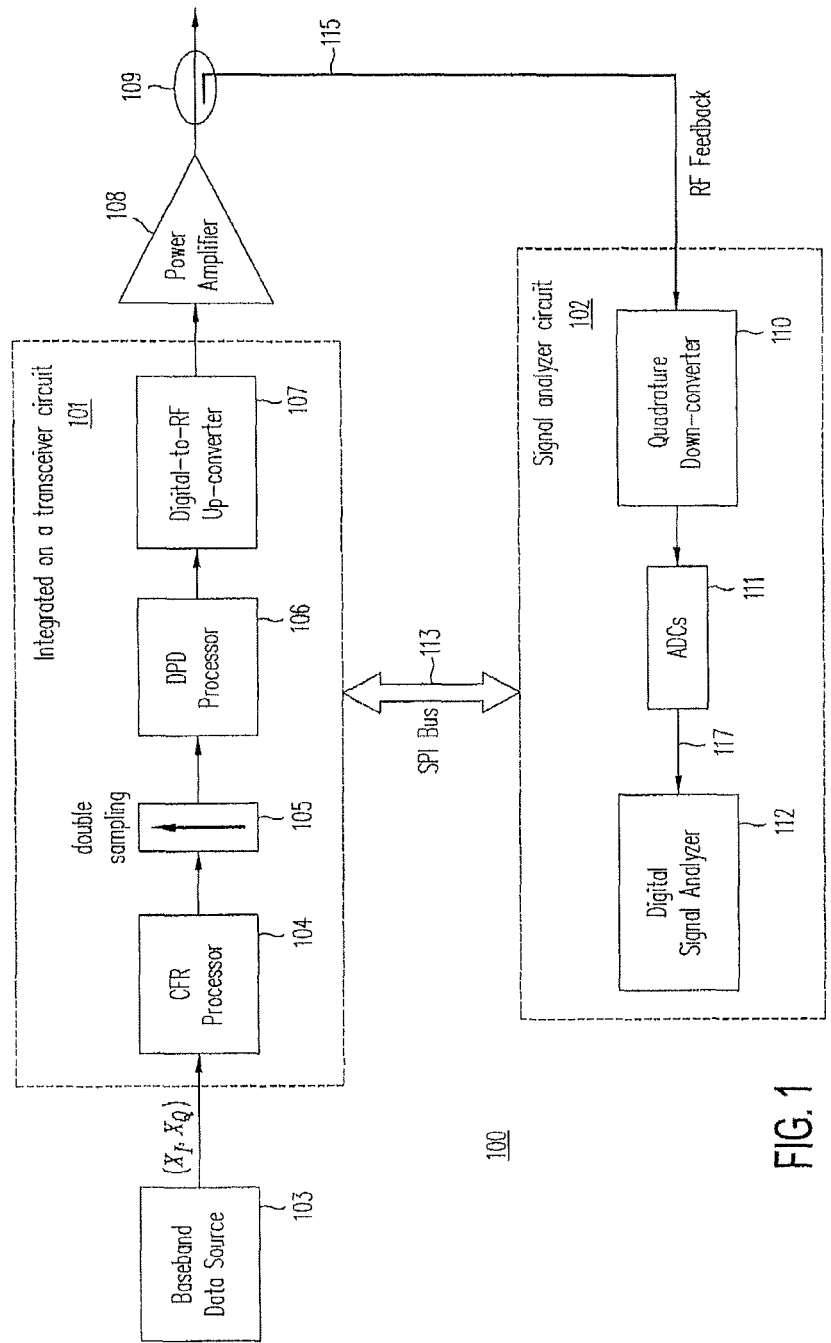
FIG. 1 is a block diagram of system 100, according to one embodiment of the present invention.

FIG. 1 is a block diagram of system 100, according to one embodiment of the present invention. System 100 integrates crest-factor reduction (CFR) and digital pre-distortion (DPD) operations on a transceiver integrated circuit that is represented by circuit block 101 of FIG. 1. The transceiver circuit may be implemented using a mixed-signal CMOS process (e.g. 65-nm CMOS at this time). As shown in FIG. 1, baseband data source 103 provides a complex baseband signal to be transmitted (e.g., a 4-carrier WCDMA or 20-MHz LTE signal). Circuit block 101, which receives the baseband signal data and signal parameters 118 (not shown; provided over SPI Bus 113) from a signal analyzer circuit 102, includes CFR processor 104, double sampler 105, DPD processor 106 and digital-to-RF up-converter 107. CFR processor 104 reduces the peak-to-average power ratio (PAR) of the input complex baseband signal. The output signal of CFR processor 104 may have a sampling rate of 34 times the bandwidth of the complex baseband signal (e.g. 61.44 MS/s for a 4-carrier WCDMA or 20-MHz LTE signal). The sampling rate is doubled by double sampler 105 to 68 times the signal bandwidth of the complex baseband signal (e.g. 122.88 MS/s for a 20-MHz LTE) before being provided to DPD processor 106. The output signal from digital-to-RF 107 is the analog signal to be transmitted that is modulated on one or more RF carrier signals and pre-distorted for linearity in power amplifier 108. CFR processor 104 may implement any of a number of crest factor reduction techniques, e.g., the crest factor reduction techniques disclosed in copending U.S. patent application ("Copending Application"), Ser. No. 13/897,119, entitled "Crest Factor Reduction for Band-Limited Multi-Carrier Signals," filed on May 17, 2013. The disclosure of Copending Application is hereby incorporated by reference in its entirety.

The output signal 115 of power amplifier 108 is fed back in system 100 through another CMOS integrated circuit, represented by circuit block 102. Circuit block 102 represents a signal-analyzer integrated circuit, which is used for adaptive control of DPD operations of system 100. As shown in FIG. 1, circuit block 102 includes quadrature down-converter 110, which down-converts the feedback signal 115. The down-converted analog signal is converted into digital representation (i.e., digital signal 117) using ADCs 111. Digital circuit 112 analyzes digital signal 117 to provide signal parameters 118. Unlike circuit block 101, circuit block 102 may be implemented using a less expensive CMOS process, and may also include other circuit blocks (e.g. a circuit for controlling the bias voltages of power amplifier 108). Communication between the circuits of circuit blocks 101 and 102 may also be conducted over industry standard data communication protocol, such as that implemented in an industry standard SPI bus (represented by SPI bus 113 in FIG. 1).

Figure 2:
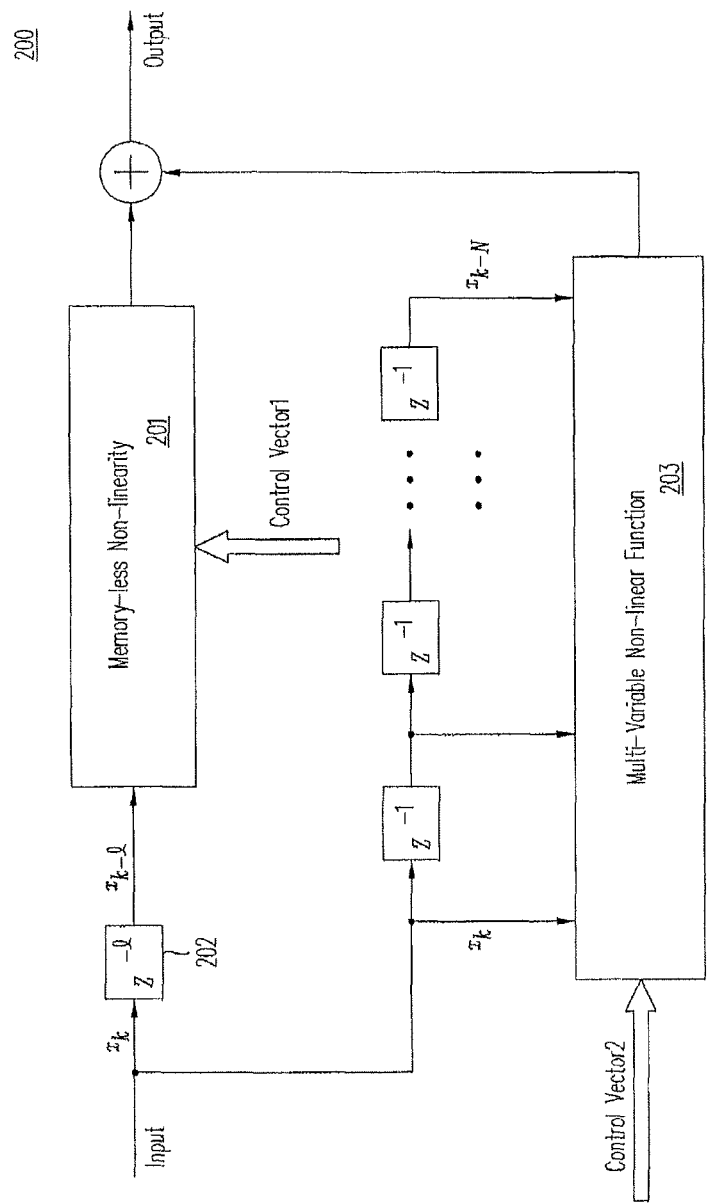
FIG. 2 is block diagram 200 representing a model of the operations carried out in DPD processor 106, according to one embodiment of the present invention.

FIG. 2 is block diagram 200 representing a model of the operations carried out in DPD processor 106, according to one embodiment of the present invention. As shown in FIG. 2, DPD processor 106 receives a sequence of complex samples $\{x_k\}$ and outputs a complex sequence $\{y_k\}$. The discrete-time input-output relation of DPD processor 106 may be represented by:

$$y_k = x_{k-\ell} G(|x_{k-\ell}|; v_1) + P(x_k, x_{k-1}, \ldots, x_{k-N}; v_2) \quad (1)$$

where $xG(|x|; v_1)$ is a memory-less non-linearity (with vector parameter $v_1$ represented by block 201 in FIG. 2. The memory-less non-linearity of block 201 is applied to a copy of the input signal delayed in delay element 202 by $\ell$ samples, N is the memory span of DPD processor 106 (e::; N) and P is a non-linear function (with vector parameter $v_2$) of N+1 complex variables, which is represented by block 203 in FIG. 2. Vector parameters $v_1$ and $v_2$ may be, for example, some of signal parameters 118 received from the signal analyzer of circuit block 102 of FIG. 1. Memory-less non-linearity of block 201 may be seen as a complex gain which depends only on the instantaneous amplitude of the input signal.

The non-linear function $P(x_k, x_{k-1}, \ldots, x_{k-N}; v_2)$ of block 203, also referred to as the "memory kernel", mitigates memory effects in power amplifier 108, which can impose a fundamental limit on the performance of DPD processor 106, as such memory effects are difficult to fully compensate for. The memory kernel may be implemented using many possible algorithms, such as memory polynomials, discrete-time Volterra series, and artificial neural networks. DPD processors in the prior art are typically complicated datapath processors because of the complexity of the algorithms implemented (e.g. discrete-time Volterra series with a large number of terms, and adaptation algorithms with extremely high computational complexity). Complex adaption algorithms include, for example, parameter estimations of complicated behavior models). The present inventors discover that the computation complexity of both the DPD processor 106 and the adaptation algorithms may be reduced. According to one embodiment of invention, DPD processor 106 may implement the following input-output relation:

$$y_k = \quad (2)$$
$$x_{k-1} G(|x_{k-1}|; v_1) + jc_0(x_k - x_{k-2}) + x_{k-1}(c_1|x_k| + c_2|x_k|^2 + c_3|x_k|^4 +$$
$$c_4|x_{k-2}| + c_5|x_{k-2}|^2 + c_6|x_{k-2}|^4) + x_k(c_1|x_k| + c_8|x_k|^2 +$$
$$c_9|x_k|^4 + x_{k-2}(c_{10}|x_{k-2}| + c_{11}|x_{k-2}|^2 + c_{12}|x_{k-2}|^4)$$

where $j=\sqrt{-1}$, $c_0$ is a real number and the $c_n$ coefficients, $1 \leq n \leq N$, are complex values. Laboratory experiments show that the low-complexity equation (2) can be implemented in a straightforward manner to deliver a surprisingly high performance over a wide range of power amplifiers, including those power amplifiers that are based on LDMOS, GaN, SiGe-HBT, GaAs and other types of transistors.

Figure 3:
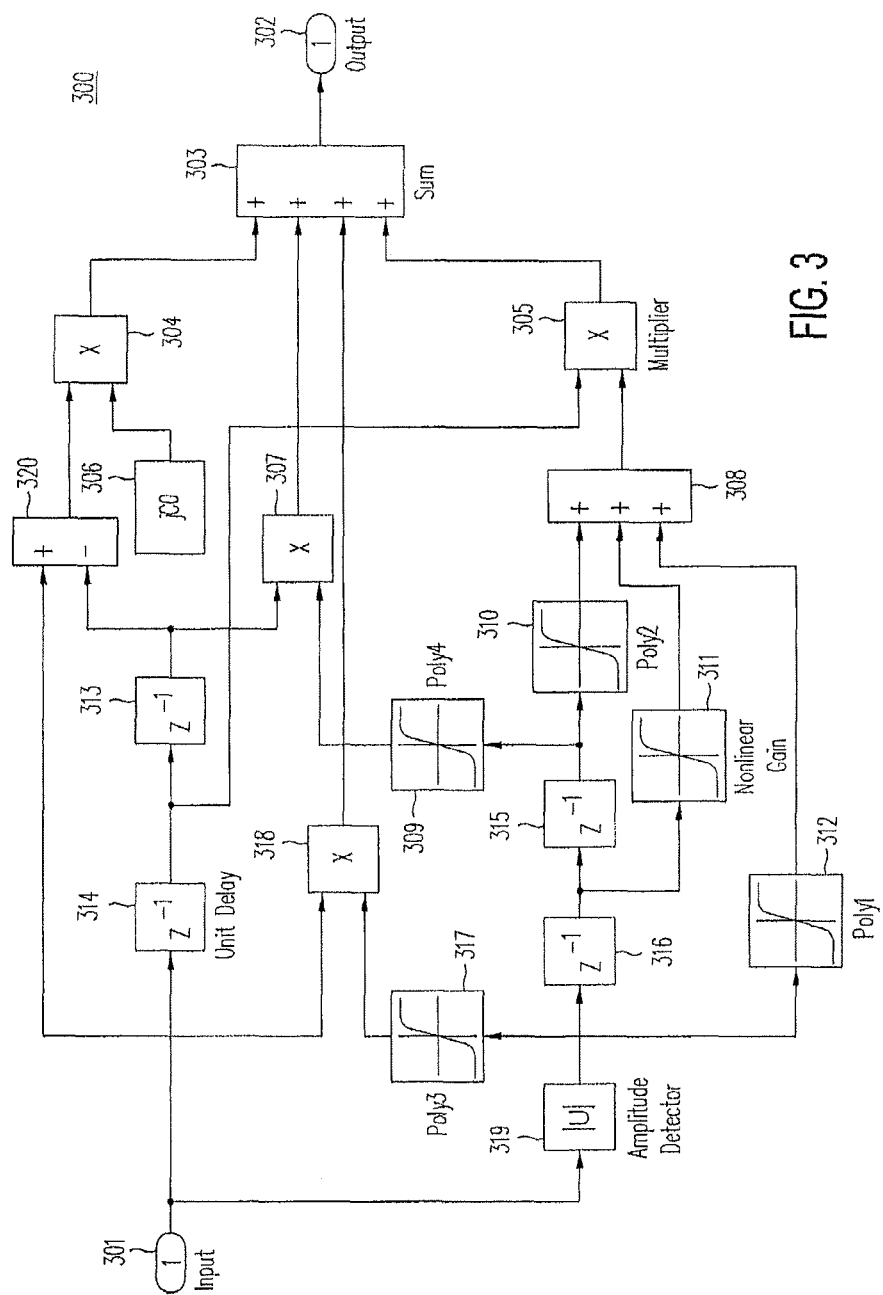
FIG. 3 shows arithmetic-logic circuit 300 in one implementation of DPD processor 106 according to low-complexity model 200 of FIG. 2.

FIG. 3 shows arithmetic-logic circuit 300 in one implementation of DPD processor 106 according to low-complexity model 200 of FIG. 2. In fact, as shown in FIG. 3, arithmetic-logic circuit 300 may be used to implement equation (2) above. Arithmetic-logic circuit 300 includes amplitude detector 319 which provides the absolute value of each incoming digital sample received from input terminal 301. The absolute values of digital samples at various delays are used, for example, in the non-linear gain and the polynomial terms of Equation (2).

Each digital sample may be represented, for example, by a fixed-point complex number in rectangular coordinate form. As some complex number computations may be simpler if carried out in polar coordinate form, amplitude detector 319 may use the CORDIC algorithm to convert a complex number from rectangular coordinate form to polar coordinate form. Computing in rectangular coordinates form, amplitude detector 319 may be implemented using multipliers and a fixed-point square-root algorithm, the absolute value of $x=x_I+jx_Q$ being $\sqrt{x_I^2+x_Q^2}$.

One way to calculate the square root takes advantage that a positive fixed-point number n may be represented in the form $n=2^m(1+\alpha)$ where m is an integer and a is a fixed-point number satisfying $0 \le \alpha < 1$. One can approximate $\log_2 n$ by the function $q \log 2(n)=m+\alpha$. The logarithm (base 2) of the square-root of n may then be expressed as $$\frac{1}{2}\log 2(n) = \frac{1}{2}m + \alpha).$$

The square root can be approximated by $$2^{m/2}\left(1+\frac{1}{2}\alpha\right)$$

for an even m, or $$2^{(m-1)/2} \times 1.414\left(1+\frac{1}{2}\alpha\right),$$

for an odd m. The digital circuit for the q log 2( ) function can be very simply implemented. Alternately, a polynomial fit may be used to calculate $\sqrt{1+\alpha}$ (e.g. $1.0013+0.4821\alpha-0.0702\alpha^2$). The square root for n using the polynomial fit is $2^{m/2}$ $(1.0013+0.4821\alpha-0.0702\alpha^2)$ for an even m, or $2^{(m-1)/2} \times 1.414(1.0013+0.4821\alpha-0.0702\alpha^2)$, for an odd m.

Returning to arithmetic-logic circuit 300 of FIG. 3, delay elements 314 and 316, multiplier 305, and non-linear gain element 311 together implements the non-linear gain term $x_{k-1}G(|x_{k-1}|; v_1)$. Non-linear gain element 311 may be implemented by a combination of look-up table (LUT) together with one-dimensional linear interpolation between adjacent table elements. Under this approach, the LUT circuit looks up a predetermined number of the most-significant-bits of its input value, and then adds to it the value of the remaining bits, which is obtained by linear interpolation. Thus, such a LUT circuit provides the piece-wise linear approximation of smooth non-linear functions.

As shown in FIG. 3, multiplier 318 and polynomial element 317 implements polynomial term $x_k P_3(|x_k|)$. Delay elements 313, 314, 315 and 316, multiplier 307, and polynomial element 309 implements polynomial term $x_{k-2}P_4(|x_{k-2}|)$. Delay elements 315 and 316, multiplier 305, adder 308 and polynomial elements 310 and 312 implements polynomial polynomial term $x_{k-1}(P_1(|x_k|)+P_2(|x_{k-2}|))$. Polynomial elements 309, 310, 312, 317 may each implement, for example, a 4th-order polynomial function such as $c1r+c2r2+c3r4$. Each polynomial element may be implemented, for example, by adders, multipliers or LUT circuits or any combination of some or all of these elements.

As mentioned above, as shown in FIG. 1, the adaptive control of DPD processor 106 is based on RF feedback signal 115, which is obtained from 30-dB coupler 109 at the output terminal of power amplifier 108. (RF feedback signal 115 may be attenuated before being provided to signal analyzer integrated circuit 102. RF feedback signal 115 is the output signal of power amplifier 108 together with some possible interference. In a multiple-input multiple-out (MIMO) system, for example, such interference may arise from multi-antenna coupling. The interference at the output terminal of coupler 109 is an antenna interference attenuated by the isolation ratio (>30 dB) of coupler 109. Typically, the signal-to-interference ratio in the feedback path of RF feedback signal 115 is better than 40 dB.

RF feedback signal 115 is converted to analog in-phase and quadrature signals by quadrature down-converter 110 in signal analyzer integrated circuit 102. Local oscillator (LO) signal 114 for down-converter 110 may be provided by a PLL-based tunable frequency synthesizer that has a frequency resolution of ~0.1 MHz. The down-converter synthesizer is adjusted to approximately the center frequency of baseband RF signal from baseband data source 103. The output I/Q signals of quadrature down-converter 110 are converted to digital signals by ADCs 111, which may be conventional pipelined ADCs with 12-bit resolution and a ~10.5-bit ENOB. The clock rate of ADCs 111 may be variable and adjusted to roughly 4.5 times the signal bandwidth, e.g. 80100 MS/s for 20-MHz LTE.

Digital signal analyzer 112 may use fast Fourier transform (FFT) and the Welch's algorithm to measure the power spectrum density (PSD) of RF feedback signal 115. Within signal analyzer integrated circuit 102, digital circuit block 112 may include a circuit for computing a 256-point FFT. From a PSD analysis, signal analyzer integrated circuit 102 obtains an estimate of the out-of-band emission power of RF feedback signal 115. Digital circuit block 112 may also include a micro-controller that runs a stochastic optimization algorithm (see, e.g., the disclosure of U.S. Pat. No. 8,136, 081). Such an optimization step adjusts the control parameters of DPD processor 106 and minimizes out-of-band emission power. Serial Peripheral Interface (SPI) bus 113 exchanges information between signal analyzer integrated circuit 102 and the transceiver integrated circuit.

In one embodiment, coefficient $c_0$ in Equation (2) above is not adjusted from minimizing the out-of-band emission power of RF feedback signal 115. Coefficient $c_0$ controls a linear filtering effect that can compensate for non-flat gain across the bandwidth of the input RF signal.

The LUT circuit in non-linear gain element 311 may be configured as a piece-wise linear approximation of the polynomial $G(r)=\Sigma_{n=1}^{10} a_n r^n$, with $a_n$ being complex-valued coefficients. For many power amplifiers, function G(r) may be further simplified to:

$$G(r)=a_1 r+a_2 r^2+a_4 r^4+a_6 r^6+a_8 r^8$$

Such a polynomial representation reduces the degree of freedom of control parameters for DPD adaptation. This adaptation method is based on finding the set of parameter values that minimize the out-of-band emission power resulting from the non-linear distortion in RF feedback signal 115. Out-of-band emission is insensitive to I/Q imbalance in quadrature down-converter 110 and other sources of interferences, such as the interference due to multi-antenna coupling in a MIMO system.

Figure 4:
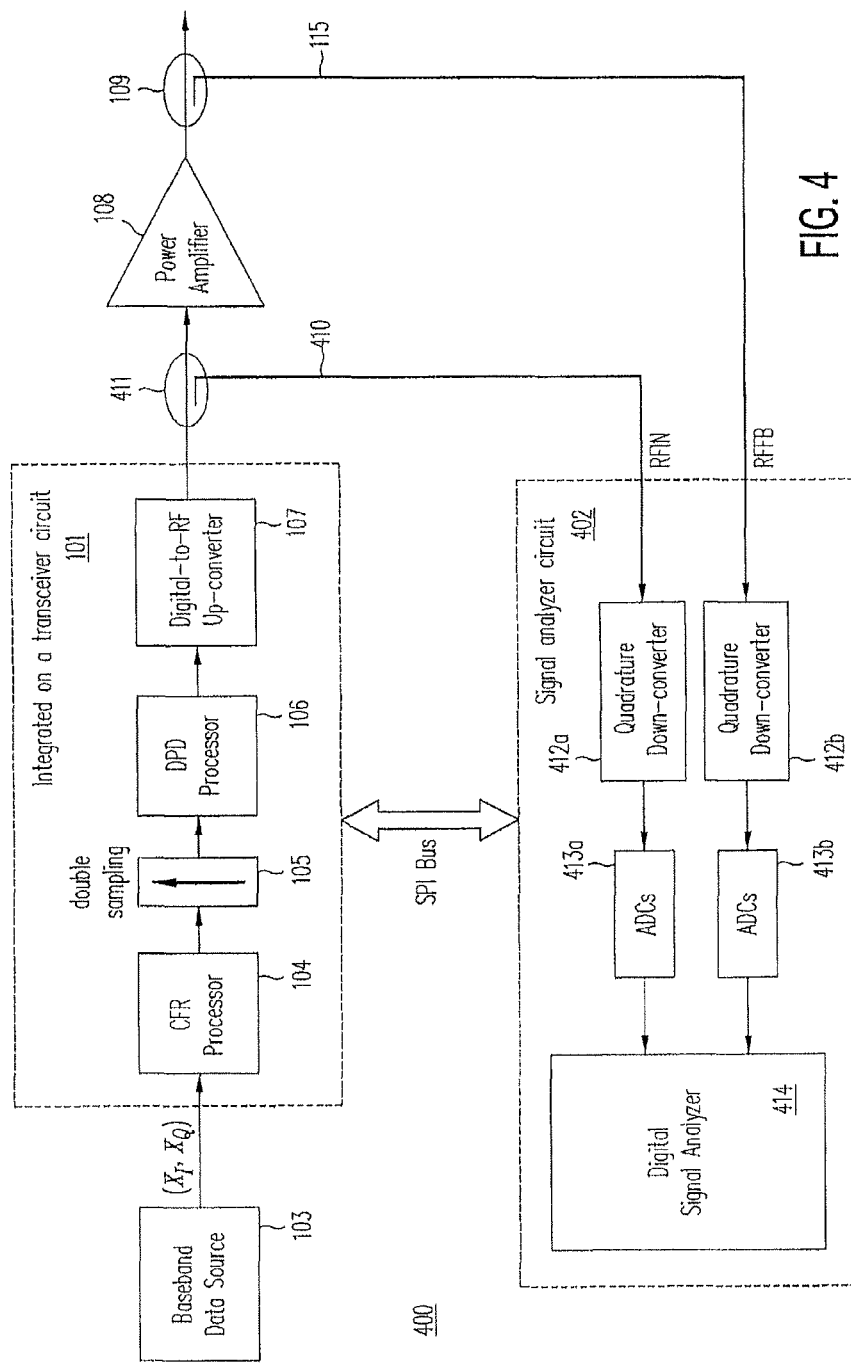
FIG. 4 is a block diagram of system 400, according to one embodiment of the present invention.

FIG. 4 is a block diagram of system 400, according to a second embodiment of the present invention. As shown in FIG. 4, in addition to RF feedback signal 115 (RFFB), signal analyzer integrated circuit 402 receives power amplifier input signal 411 (RFIN). Complex baseband digital signals are obtained from RF feedback signal 115 and power amplifier input signal 411 using quadrature down-converters 412a and 412b. Quadrature down-converters 412a and 412b may be provided the same LO signal 114. The down-converted feedback signals are converted to digital domain in ADCs 111, ADCs 111 are shown in FIG. 4 as ADCs 413a and 413b. Signal analyzer integrated circuit 402 measures not only the power spectral density (PSD) of each input signal, but also the relative waveform distortion between RF feedback signal 115 and power amplifier input feedback signal 410. Using a signal analyzer that operates on an output signal of a power amplifier so as to control linearity of the power amplifier is taught, for example, in U.S. Pat. No. 8,145,150.

Figure 5:
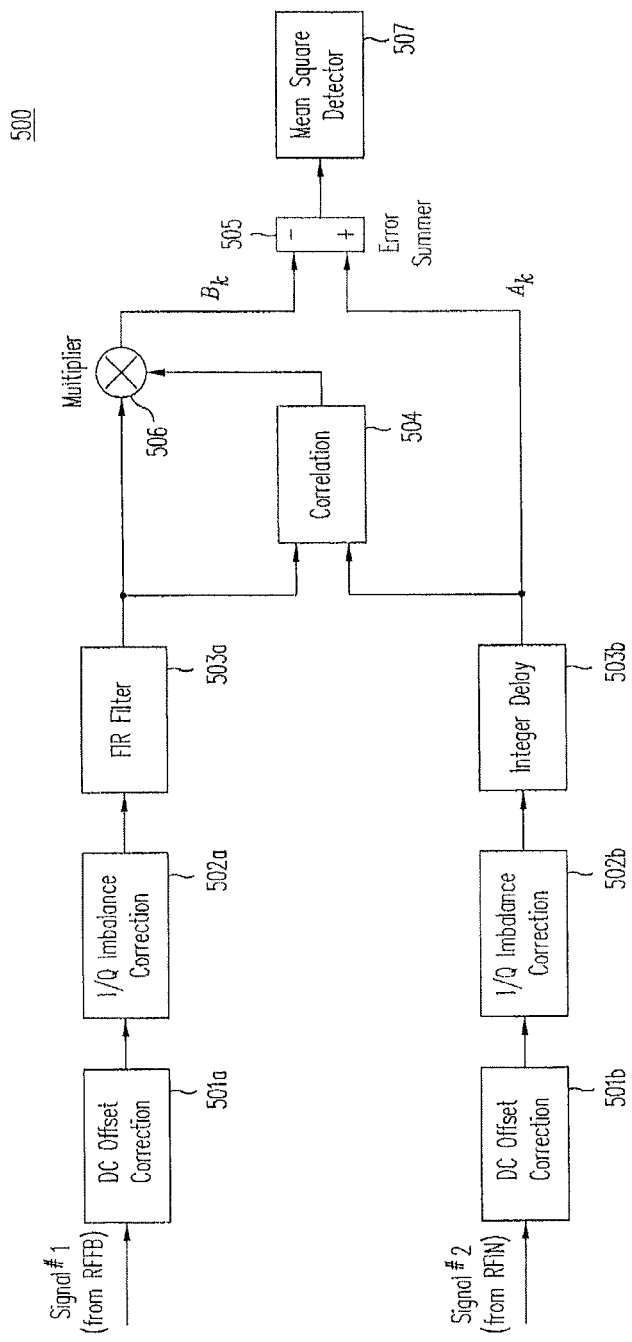
FIG. 5 is a block diagram of digital waveform matching circuit 500, which implements a method for measuring relative waveform distortion, according to one embodiment of the present invention.

Relative waveform distortion may be measured in signal analyzer integrated circuit 402 using a digital waveform-matching subsystem, such as waveform-matching circuit 500 illustrated by block diagram in FIG. 5. (Although waveform matching circuit 500 is described herein as a circuit, the operations carried out in waveform matching circuit 500 may also be implemented, entirely or in part, in software executable on a microprocessor). Waveform matching circuit 500 corrects for DC offset, I/Q imbalance, and linear distortion in both RF feedback signal 115 and power amplifier input feedback signal 410. As shown in FIG. 5, waveform matching circuit 500 provides DC offset corrections to RF feedback signal 115 and power amplifier feedback signal 410 in DC offset correction circuits 501a and 501b, respectively. The DC offset-corrected signals are then corrected for I/Q imbalance in I/Q imbalance correction circuits 502a and 502b, respectively. The following method may be used for correcting I/Q imbalances:

(a) Detuning the LO frequency of a quadrature down-converter (e.g., down-converter 412a or 412b) from the center frequency of RF signals (e.g. RF feedback signal 115 or power amplifier input feedback signal 114) by an amount equal to or slightly higher than half of the RF signal bandwidth;
(b) measuring the PSD that shows the mirror-leakage power due to I/Q imbalance; and
(c) adjusting the I/Q imbalance parameters of waveform matching circuit (e.g., I/Q imbalance correction circuit 502a or 502b) to minimize the mirror-leakage power.

FIG. 5 also shows complex gain and delay matching by finite impulse response (FIR) filter 503a and integer delay circuit 503b in the signal paths of RF feedback signal 115 and power amplifier input feedback signal 410, respectively. FIR filter 503a includes a complex-coefficient FIR filter that provides, not only delay matching, but also linear distortion correction. Complex gain and delay matching may be accomplished, for example, using the techniques disclosed in U.S. Pat. No. 8,295,394. Waveform matching circuit 500 provides matched complex signals ($A_k$ and $B_k$), in which signal $B_k$ is the complex gain and delay matched output signal of FIR filter 503a, weighted by a correlation between the output signal of FIR filter 503a and the output signal $A_k$ of delay circuit 503b. Error signal $A_r$-$B_k$ is provided by summer 505. An optimum matching is achieved by minimizing mean square error detected at mean square error detector 507 of the error signal $A_k$-$B_k$ (i.e. the average power of $|A_k$-$B_k|^2$).

From statistical samples of $A_k/B_k$, signal analyzer 414 measures the conditional expectations:

$$\xi_m = E\{(A_k/B_k)|r_m \leq |B_k| < r_m + \Delta r\}, \text{ for } r_m = (m-0.5)\Delta r,$$
$$m=1,2,\ldots \qquad (3)$$

where the selected step size $\Delta r$ may be a fraction (e.g., 1/32) of the envelope peak. Using the calculated conditional expectations, the LUT circuit of non-linear gain element 311 in DPD processor 106 are programmed to contain:

$$G(m\Delta r) \qquad (4)$$

The stored values in the LUT circuits are monitored and updated from time to time. The memory kernel coefficients (except for $c_0$) are controlled to minimize the out-of-band emission in RF feedback signal 115.

According to one embodiment of the present invention, signal analyzer integrated circuit 102 may be implemented, for example, by the RFPAL product from Scintera Corporation, Santa Clara, Calif. in conjunction with a microcontroller (e.g., Intel 8051). Signal analyzer integrated circuit 102 carries out the following basic functions:

(a) monitoring the average power and power spectrum of RF feedback signal 115 (RFFB) and power amplifier input signal 410 (RFIN);
(b) waveform matching between the RFIN and RFFB signals;
(c) monitoring the transmitter LO leakage that causes a spectral line on the power spectrum;
(d) monitoring the transmitter I/Q imbalance from the mutual correlation and average-power imbalance between the I/Q components; and
(e) monitoring the power amplifier status, such as bias voltages and ambient temperatures.

Figure 6:
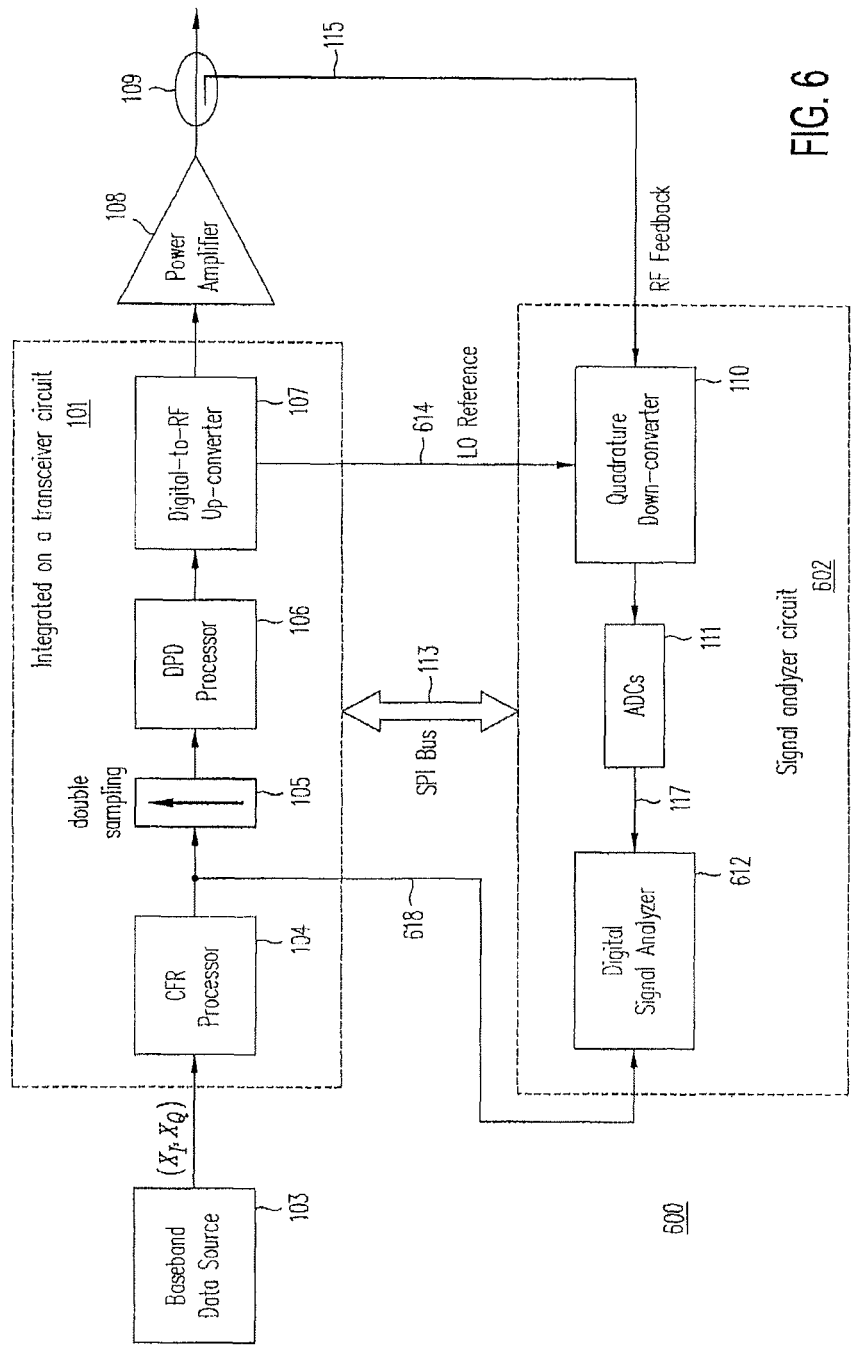
FIG. 6 is a block diagram of system 600, in accordance with one embodiment of the present invention.

FIG. 6 is a block diagram of system 600, in accordance with one embodiment of the present invention. In system 600, in addition to receiving RF feedback signal 115 and exchanging data and control signals generally over SRI bus 113, signal analyzer integrated circuit 602 also receives from transceiver circuit block 101 output data signal 618 of CFR processor 104, and local oscillator (LO) reference timing signal 614. Up- and down-converters in system 600, i.e., up-converter in digital-to-RF up-converter 107 and quadrature down-converter 110, may be controlled by common LO reference timing signal 614. LO reference timing signal 614 may be obtained, for example, from a crystal oscillator from the up-converter synthesizer in digital-to-RF up-converter 107. Sharing reference timing signal 614 between digital-to-RF up-converter 107 and quadrature down-converter 110 allows phase synchronization between the frequency synthesizers. Quadrature down-converter 110 has a synthesizer that is normally adjusted to the nominal center frequency of RF feedback signal 115 plus a small frequency offset. The frequency offset results from a coarser frequency resolution in the synthesizer of quadrature down-converter 110, relative to the frequency resolution in the synthesizer the up-converter in digital-to-RF up-converter 107. Output data signal 618 of CFR processor 104 also shares a timing signal with ADCs 111.

Figure 7:
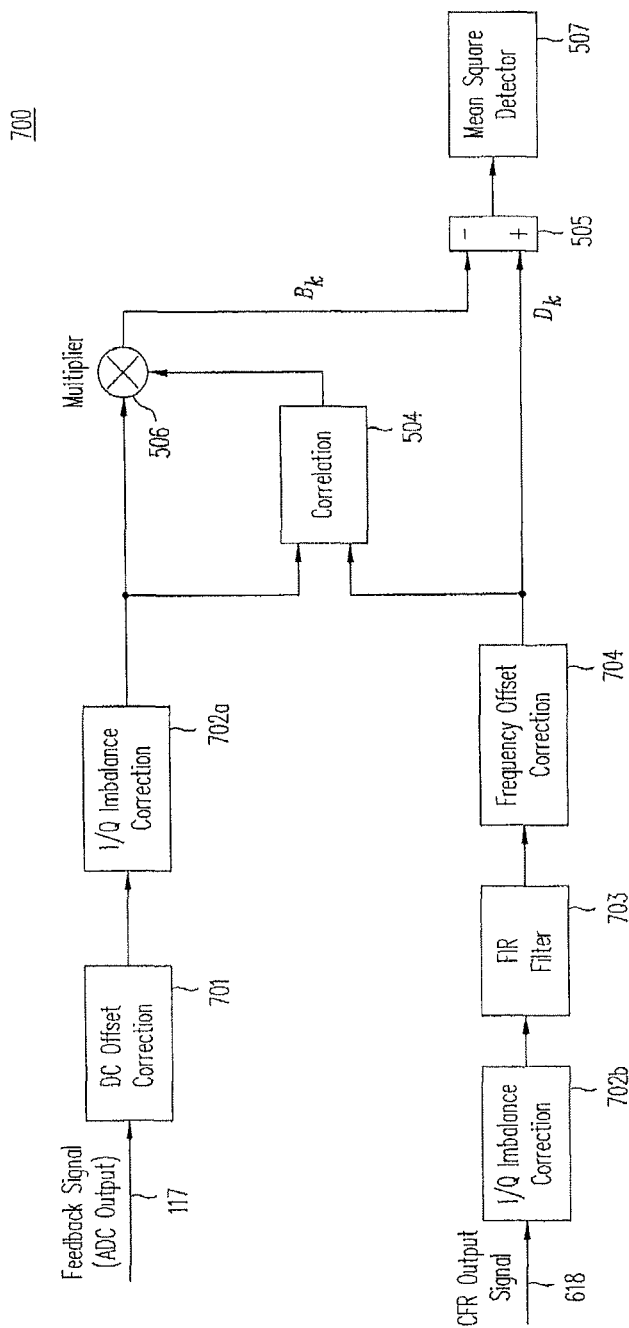
FIG. 7 shows waveform matching circuit 700, which performs DC offset correction, I/Q imbalance correction, frequency offset correction, linear distortion correction, delay matching, and complex gain matching, in accordance with one embodiment of the present invention.

Digital signal analyzer 612 of FIG. 6 receives both digital data signal 618, which is the crest factor-reduced complex baseband input signal from data source 103, and digital signal 117, which is the digital representation from ADCs 111 of down-converted RF feedback signal 115. In addition to PSD measurement, digital signal analyzer 612 provides waveform matching between digital data signal 618 and digital signal 117. FIG. 7 shows waveform matching circuit 700, which performs DC offset correction on digital signal 117 (block 701), I/Q imbalance correction on both digital data signal 618 and digital signal 117 (blocks 702a and 702b, respectively), frequency offset correction, linear distortion correction, delay matching, and complex gain matching (FIR filter block 703 and frequency correction block 704), in accordance with one embodiment of the present invention. (Although waveform matching circuit 700 is described herein as a circuit, the functions of waveform matching circuit 700 may also be performed, entirely or in part, by software executable in a microprocessor or a digital signal processor.) Waveform matching circuit 700 generates matched signals $D_k$ and $B_k$, which are respectively the output signal of frequency correction block 704 and the output signal of I/Q compensation correction block 702a, weighted by a correlation between signal DK and the output signal of I/A imbalance correction block 704. A difference between the two matched signals is taken at summer 505. Optimum matching is achieved by minimizing mean square error (i.e., the average power of $|D_k-B_k|^2$).

From statistical samples of $D_k/B_k$, signal analyzer 612 measures the conditioned expectations:

$$\zeta_m = E\{(D_k/B_k)|r_m < |B_k| < r_m + \Delta r\}, \text{ for } r_m = (m-0.5)\Delta r,$$
$$m = 1, 2 \ldots \quad (5)$$

The table data in the LUT circuits for non-linear gain model 311 of DPD processor 106 are updated to $$G^{(new)}(m\Delta r) = \zeta_m \cdot G^{(old)}(m\Delta r) \quad (6)$$

The memory kernel coefficients (except for $c_0$) in DPD processor 106 are controlled to minimize the out-of-band emission of the feedback signal.

One advantage of the adaptation methods of the present invention allows the sampling rate of RF feedback signal 115 to be reduced to only 34 times the signal bandwidth (e.g. 61.44 MS/s for 20-MHz LTE). Therefore, transceiver integrated circuit 101 may send digital data signal 618 to digital signal analyzer 612, instead of the double-sampled signal (i.e., the input signal to DPD processor 106). In contrast, conventional DPD models for the power amplifiers must use the double-sampled signal for parameter estimation. Because the methods can take advantage of a lower ADC rate, signal analyzer 612 may be substantially simpler than conventional signal analyzers for DPD applications.

Figure 8:
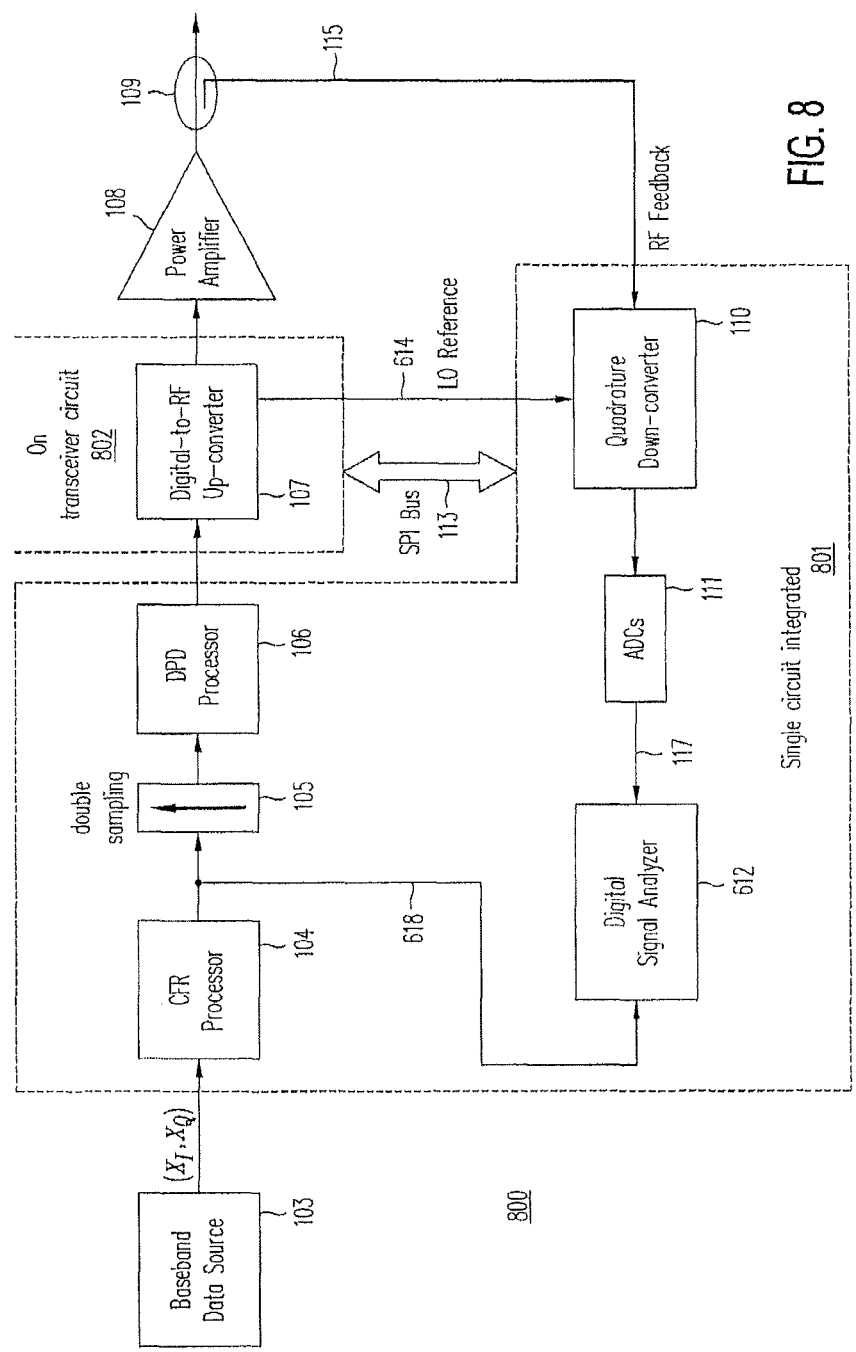
FIG. 8 shows system 800, which CFR processor 104, DPD processor 106, and signal analyzer 612, quadrature down-converter 110 are integrated into a single integrated circuit, in accordance with one embodiment of the present invention.

FIG. 8 shows system 800, which CFR processor 104, DPD processor 106, and signal analyzer 612, quadrature down-converter 110 are integrated into a single integrated circuit, in accordance with one embodiment of the present invention. As shown in FIG. 8, Digital-to-RF up-converter 107 may be integrated into a transceiver integrated circuit (e.g., transceiver integrated circuit 802), which may be manufactured using a prevailing CMOS circuit manufacturing technology (e.g. 65-nm or 45-nm CMOS in year 2013). At the same time, the digital circuits, such as CFR processor 104, DPD processor 106, and signal analyzer 612, quadrature down-converter 110, may be manufactured using an older CMOS process (e.g. 0.13-μm CMOS) to take advantage the trade-off between development cost and power consumption, as CFR and DPD algorithms applicable to the present invention are low complexity and high performance.

Figure 9:
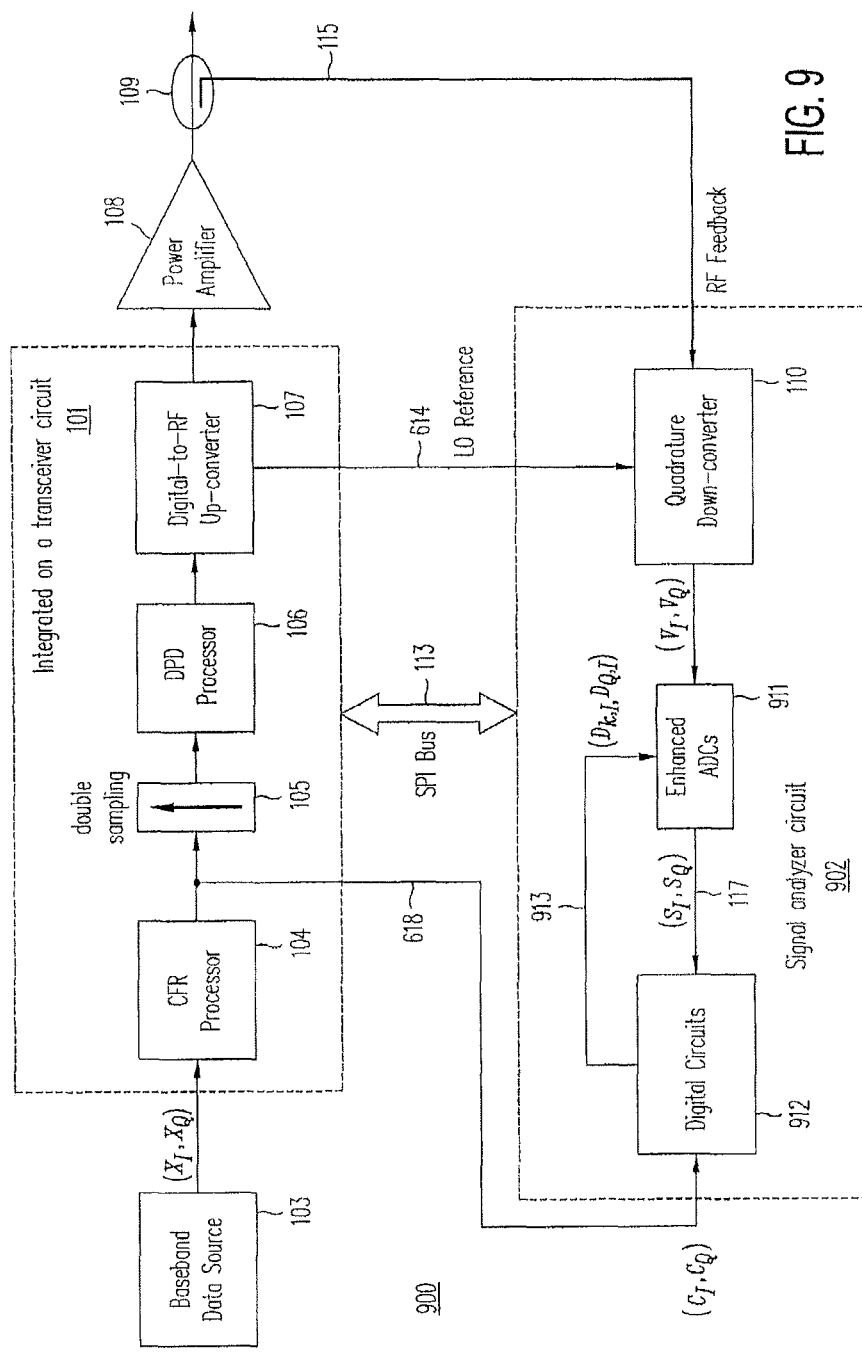
FIG. 9 is a block diagram of system 900, including enhanced ADC 911, in accordance with one embodiment of the present invention.

FIG. 9 is a block diagram of system 900, including enhanced ADC 911, in accordance with one embodiment of the present invention. Enhanced ADC 911 provides a higher analog-to-digital conversion rate and accuracy at a lower power than conventional pipelined ADC. As shown in FIG. 9, system 900 is similar to system 600 of FIG. 6, with enhanced ADC 911 receiving digital signals 913 from digital signal analyzer 912. Digital signals 913 includes digital signals $D_{k,I}$ and $D_{k,Q}$, which are used to enhanced conversion rate and accuracy in analog-to-digital conversion for the down-converted quadrature signals derived from RF feedback signal 115.

Figure 10:
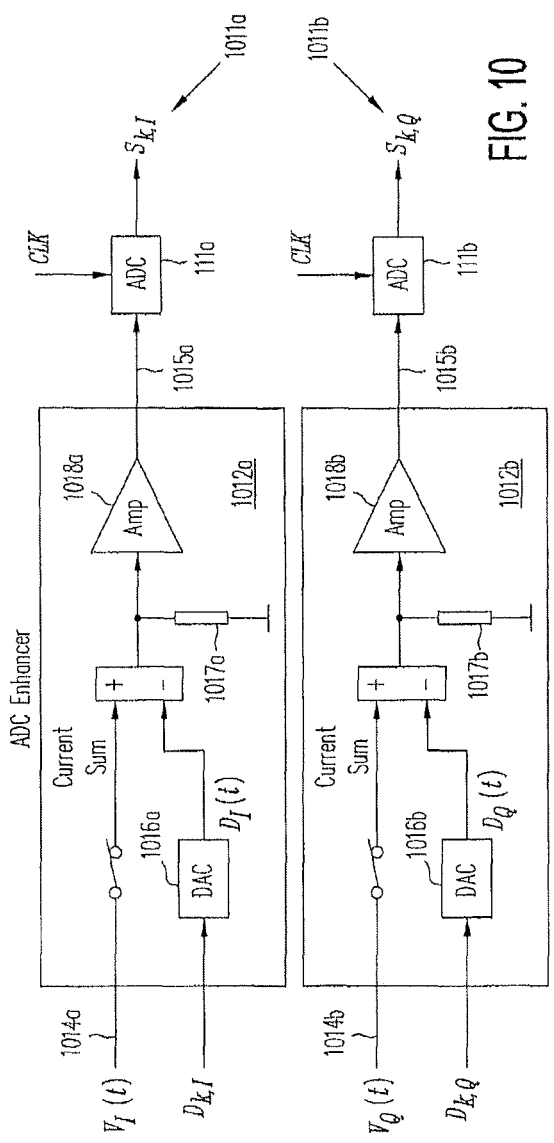
FIG. 10 is a block diagram showing enhanced ADCs 1011a and 1011b for the down-converted in-phase and quadrature analog signals derived from RF feedback signal 115, respectively, in accordance with one embodiment of the present invention.

FIG. 10 is a block diagram showing enhanced ADCs 1011a and 1011b for the down-converted in-phase and quadrature analog signals derived from RF feedback signal 115, respectively. The down-converted in-phase and quadrature analog signals derived from RF feedback signal 115 are shown in FIG. 10 as analog signals 1014a and 1014b. Enhanced ADCs 1011a and 1011b each include an ADC enhancer circuit, shown in FIG. 10 as ADC enhancer circuits 1011a and 1011b, respectively. ADC enhancer circuits 1011a and 101b receive signals $D_m$ and $D_{k,Q}$ and analog signals 1014a and 1014b to provide output signals 1015a and 1015b to conventional ADCs 111a and 111b, respectively. (Conventional ADC 111a and 111b may be implemented using the same circuits in ADC 111 of FIGS. 1, 4 and 6). Typically, quadrature down-converter 110 provides current-mode output for analog signals 1014a and 1014b. ADC enhancer circuits 1012a and 1012b use a current-steering digital-to-analog converter (DAC) technique. From input analog current signal V(t) (i.e., analog signals 1014a or 1014b) and digital signal $D_k$ (i.e., $D_{k,I}$ or $D_{k,Q}$), ADC enhancer circuit 1012a or 1012b generates an analog signal V(t)−D(t) through the current sum. In FIG. 10, current $D(t) = \Sigma_k D_k u(t-kT)$ is the output current of DAC 1016a or 1016b, where u(t) is a rectangular pulse with one clock-period duration. The V(t)−D(t) current is converted to analog voltage by load impedance 1017a or 1017b, followed by amplification in voltage amplifier 1018a or 1018b. Signals in ADC enhancer circuits 1012a and 1012b are preferably implemented as differential signals.

A front-end circuit in ADC 111a or 111b is a switching capacitor track-and-hold (T/H) circuit driven clock signal CLK. The clock rate ("sub-ADC sampling rate") may be a multiple of the data rate of digital signal $D_k$. To simplify the following discussion, the sub-ADC sampling rate is provided to be the same as the data rate of digital signal $D_k$. ADC 111a and 111b provides digital signal $S_{k,I}$ and $S_{k,Q}$. $S_k$ (i.e., $S_{k,I}$ or $S_{k,Q}$) is given by:

$$S_{k+\tau} = A \cdot [V(t_k) - D_k \delta] + q_k \quad (7)$$

where τ is an integer delay, A is the gain of ADC enhancer circuit 1012a or 1012b, δ is a DC offset, and $q_k$ is a residual error dominated by the quantization error of ADC 111a or 111. The (A,δ) parameters of ADC enhancer circuits 1012a or 1012 may be accurately identified from a calibration by turning off analog input current V(t).

Figure 11:
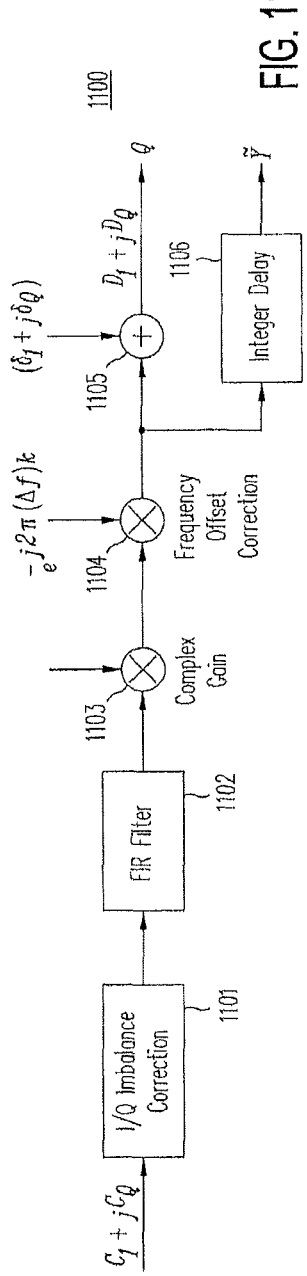
FIG. 11 shows waveform-transform circuit 1100, providing complex-valued digital signal $D_I+jD_Q$, in accordance with one embodiment of the present invention.

The complex-valued digital signal $D_I + jD_Q$, is generated from waveform-transform circuit 1100 shown in FIG. 11. Waveform transform circuit 1100 receives a copy of digital data signal 618 from CFR processor 104. Digital data signal 618 may be represented as the value $C_I + jC_Q$. Waveform-transform circuit 1100 first performs an I/Q imbalance correction (block 1101), FIR filtering (block 1102, for delay matching and linear distortion correction), complex gain adjustment (mixer 1103), frequency offset correction (mixer 1104), and DC offset correction (summer 1105). To provide frequency offset correction, the gain-adjusted complex-valued signal is multiplied with $e^{-j2\pi(\Delta f)k}$. For nearly-zero-IF down-conversion with a small frequency offset, the data rate of the $D_I+jD_Q$ equals to the data rate of digital data signal $C_I+jC_Q$, which is 34 times the original RF bandwidth (e.g. 61.44 MS/s for 20-MHz LTE).

Analog amplifiers in ADC enhancer circuits 1011a and 1011b may be provided by open-loop amplifiers without precise gain control and may be designed to have selectable low, medium, and high-gain modes. For example, the enhancer gain is 0, 15, and 30 dB. The enhanced ADCs start operation from the following procedure:

(a) switching the ADC enhancer circuits 1011a or 1011b to a low-gain mode;

(b) Using a stochastic optimization algorithm (e.g. any suitable one of the algorithms disclosed in U.S. Pat. No. 8,136,081) to adjust the control parameters of the waveform-transform circuit 1100 and to minimize the average power of output signal $S_I+jS_Q$ of ADC 111a or 111b;

(c) switching ADC enhancer circuits 1011a and 1011b to a medium-gain mode;

(d) redoing waveform matching (i.e. adjusting the control parameters of the waveform-transform circuit 1100) to minimize the average power of $S_I+jS_Q$;

(e) reconstruct the signal $V_I+jV_Q$ as:

$$V_{k,I}=D_{k,I}-\delta_I+S_{k+\tau,I}/A_I \text{ and } V_{k,Q}=D_{k,Q}-\delta_Q+S_{k+\tau,Q}/A_Q \qquad (8)$$

and;

(f) switching ADC enhancer circuits 1011a and 1011b to a high-gain mode, and repeating steps (d) and (e) periodically.

The precision or ENOB enhancement of the reconstructed signal given by equation (8) is approximately $(20 \log_{10}A)/6$ bits, with $(20 \log_{10}A)$ the enhancer gain in dB. Enhanced ADCs (e.g., enhanced ADCs 911) directly generate two complex-valued digital signals expressed as $$\tilde{Y}_{k+\tau}=(D_{k,I}+jD_{k,Q})-(\delta_I+j\delta_Q) \qquad (9)$$

$$\tilde{B}_k=\tilde{Y}_k(S_{k,I}/A_I+jS_{k,Q}/A_Q) \qquad (10)$$

where $\tilde{Y}_k$ is a delayed copy of the frequency-offset corrected output in FIG. 11 (e.g., output value of integer delay block 1106), and $\tilde{B}_k$ accurately digitizes the quadrature down-converter output. $\tilde{Y}_k$ and $\tilde{B}_k$ are a pair of matched signals. After removing the I/Q imbalance and DC offsets of quadrature down-converter 110, corrected signals $Y_k$ and $B_k$ are obtained. From statistical samples of $Y_k/B_k$, the signal analyzer can measure the conditioned expectations $$\zeta_m=E\{(Y_k/B_k)|r_m<|B_k|<r_m+\Delta r\}, \text{ for } r_m=(m-0.5)\Delta r;$$
$$m=1,2,\ldots \qquad (11)$$

which may be used to update the values in the LUT circuits in DPD processor 106 to compensate for the memory-less non-linearity in power amplifier 108. As for the non-linear memory effects, DPD processor 106 minimizes the out-of-band emission of RF feedback signal 115.

As discussed above, initially, ADC enhancer circuits 1011a and 1011b are at a low-gain mode. In this initial stage, digital pre-distortion techniques can only linearize power amplifier 108 to a point with relatively poor linearity, due to the coarse precision of ADCs 111a and 111b. In the next step, ADC enhancer circuits 1011a and 1011b are switched to a medium-gain mode, and the enhanced precision of ADC 111a and 111b improves the pre-distortion. Then, the enhancer circuits 1011a and 1011b are switched to a high-gain mode and the output signal of power amplifier 108 can achieve further a higher linearity. The maximum-allowed ADC enhancer circuit gain is limited by residual non-linear distortions that cannot be removed by digital pre-distortion techniques. Lab experiments have shown that, for a large variety of power amplifiers, the DPD methods of the present invention allow for 30-dB or higher ADC enhancer circuit gain. Therefore, the ADC enhancer circuit of the present invention can provide ENOB enhancement of 5-bit or more.

The ADC enhancer circuits of the present invention lower the requirement on ADCs. As a result, power efficient 6-bit ADCs may be selected with a ~5.5-bit ENOB. For example, time-interleaved successive approximation ADCs or folding-flash ADCs may be used. Such ADCs may operate at a sampling rate of 1000 MS/s in 65-nm CMOS. Enhanced ADCs of the present invention may provide an ENOB of 10.5 bit or higher at significantly lower power than conventional pipelined ADCs.

The down-converted RF feedback signal from power amplifier 108 includes a large known signal component. The present invention provides a mixed-signal processing method (the ADC enhancer circuit) that can separate the known signal from the residual distortion and noise. The analog-to-digital (A/D) conversion of the distortion plus noise is much easier than direct A/D conversion of RF feedback signal 115. The undesired distortion may be suppressed by digital pre-distortion techniques. The present invention also provides a novel DPD method that performs well in conjunction with the ADC enhancement technique.

Figure 12:
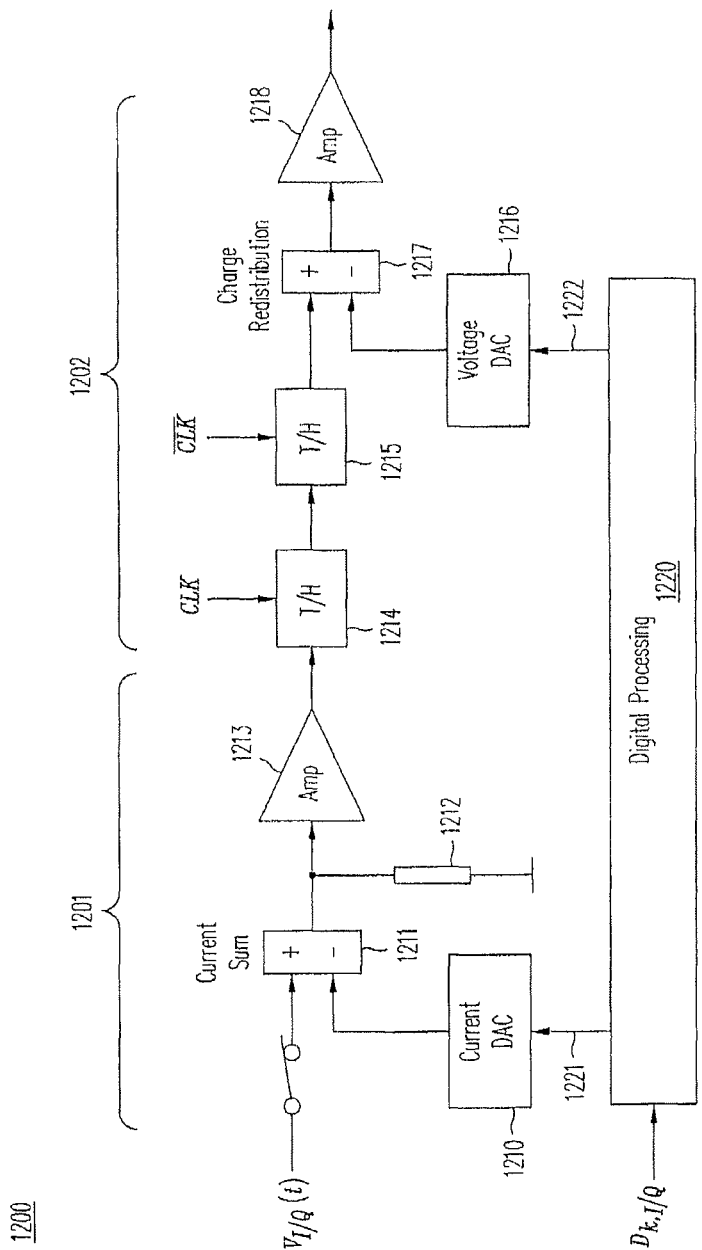
FIG. 12 is a block diagram showing two-stage ADC-enhancer circuit 1200, in accordance with one embodiment of the present invention.

FIG. 12 is a block diagram showing two-stage ADC enhancer circuit 1200, in accordance with one embodiment of the present invention. ADC enhancer circuit 1200 may be used in each of I and Q channels. First-stage 1201 of ADC enhancer circuit 1200 applies the current-steering technique discussed above in conjunction with FIG. 10. Cascaded T/H circuits 1214 and 1215 driven by complementary clock signals serve as a master-slave sample-and-hold block that holds analog samples for each clock period. Second stage 1202 of ADC enhancer circuit 1200 uses a charge-redistribution technique to acquire each analog voltage sample, which is then subtracted from a voltage from a voltage output DAC 1216. The difference signal is amplified in amplifier 1218 and then provided to an ADC, such as conventional ADC 111 discussed above. Thus, with analog input signal V(t) and digital input signal $D_k$, an enhanced ADC of the present invention incorporating ADC enhancer circuit 1200 provides:

$$S_{k+\tau}=A_2A_1[V(t_k)-D_k^{(1)}]-A_2D_{k+1}^{(2)}+A_2A_1\delta+q_k \qquad (12)$$

where $D_k^{(1)}$ and $D_k^{(2)}$ (i.e., 1221 and 1222) are the input signals from digital processing circuit 1220 to first and second stages 1201 and 1202, respectively; and $A_1$ and $A_2$ are the gains of amplifiers 1213 and 1218. The parameters $(A_1, A_2, \delta)$ can be accurately identified 30 from calibrations. In one embodiment, signal $D_k$ is provided as:

$$D_k^{(1)}=A_1\cdot\text{round}(D_k/A_1), D_k^{(2)}=A_1(D_{k-1}-D_{k-1}^{(1)}) \qquad (13)$$

such that:

$$S_{k+\tau}=A_2A_1[V(t_k)-D_k+\delta]+q_k \qquad (8)$$

which is identical to the value of $S_{k+\tau}$ obtained from equation (7), when the ADC enhancer circuit gain $A=A_1A_2$.

The enhanced ADCs of the present invention can operate at a sampling rate of 1000 MS/s or higher. Thus, signal analyzer 902 can support non-zero intermediate-frequency down-conversion for RF signals with an original bandwidth up to 100 MHz. In one embodiment, only one ADC associated with either the in-phase or quadrature component is used for signal analysis. A double-rate or quadruple-rate up-sampler may preferably be inserted, for example, between complex-gain multiplier 1103 and frequency-offset multiplier 1104 of FIG. 11, as the intermediate frequency is typically ~2.5 times the bandwidth of the original RF signal. If a quadruple-rate up-sampler is provided, the ADC clock rate is also preferably the quadruple rate.

The above detailed description is provided to illustrate the specific embodiments of the present invention and is not intended to be limiting. Numerous modifications and variations within the scope of the present invention are possible.

The present invention is set forth in the accompanying claims.

We claim:

1. A system comprising:
   a crest-factor reduction circuit that reduces a crest factor of a baseband signal and that generates a feedforward signal;
   a signal analyzer that generates parameters based on the feedforward signal and an output signal from a power amplifier;
   a pre-distortion circuit that generates a pre-distorted baseband signal based on the parameters for input to the power amplifier; and
   an over-sampler that increases a data rate of the feedforward signal by at least a factor of 2.

2. The system of claim 1 wherein the pre-distortion circuit generates the pre-distorted baseband signal by applying a memoryless nonlinear gain and a polynomial function to the baseband signal.

3. The system of claim 2 wherein the memoryless nonlinear gain is applied after a unit delay to the baseband signal.

4. The system of claim 1 further comprising:
   an up-converter that converts the pre-distorted baseband signal based on a timing signal to a pre-distorted signal input to the power amplifier,
   wherein the signal analyzer comprises:
   a downconverter that converts the output signal from the power amplifier based on the timing signal to a first signal that is at baseband or at a near-baseband intermediate frequency;
   an analog-to-digital converter that converts the first signal to a second signal; and
   a signal analysis circuit that generates the parameters based on the second signal and the feedforward signal.

5. The system of claim 4 wherein the signal analysis circuit performs one or more of DC offset correction, frequency offset correction, I/Q imbalance correction, delay matching, and gain adjustment on one or more of the second signal and the feedforward signal.

6. The system of claim 4 wherein the signal analysis circuit generates the parameters based on minimizing a difference between the second signal and the feedforward signal.

7. The system of claim 2 wherein the polynomial function is based on the baseband signal and a delayed version of the baseband signal and comprises a power of a modulus of the baseband signal and a power of a modulus of the delayed version of the baseband signal.

8. A system comprising:
   a crest-factor reduction circuit that reduces a crest factor of a baseband signal and that generates a feedforward signal;
   a signal analyzer that generates parameters based on the feedforward signal and an output signal from a power amplifier; and
   a pre-distortion circuit that generates a pre-distorted baseband signal based on the parameters for input to the power amplifier,
   wherein the pre-distortion circuit generates the pre-distorted baseband signal by applying a memoryless nonlinear gain and a polynomial function to the baseband signal, and
   wherein the polynomial function is based on the baseband signal and a delayed version of the baseband signal and comprises a power of a modulus of the baseband signal and a power of a modulus of the delayed version of the baseband signal.

9. The system of claim 8 wherein the memoryless nonlinear gain is applied after a unit delay to the baseband signal.

10. The system of claim 8 further comprising an over-sampler that increases a data rate of the feedfoward signal by at least a factor of 2.

11. The system of claim 8 further comprising:
    an up-converter that converts the pre-distorted baseband signal based on a timing signal to a pre-distorted signal input to the power amplifier,
    wherein the signal analyzer comprises:
    a downconverter that converts the output signal from the power amplifier based on the timing signal to a first signal that is at baseband or at a near-baseband intermediate frequency;
    an analog-to-digital converter that converts the first signal to a second signal; and
    a signal analysis circuit that generates the parameters based on the second signal and the feedforward signal.

12. The system of claim 11 wherein the signal analysis circuit performs one or more of DC offset correction, frequency offset correction, I/Q imbalance correction, delay matching, and gain adjustment on one or more of the second signal and the feedforward signal.

13. The system of claim 11 wherein the signal analysis circuit generates the parameters based on minimizing a difference between the second signal and the feedforward signal.

14. A system comprising:
    a downconverter that converts an output signal from a power amplifier to a first signal that is at baseband or at a near-baseband intermediate frequency;
    an analog-to-digital converter that converts the first signal to a second signal;
    a signal analysis circuit that generates parameters based on the second signal and a feedforward signal representative of a baseband signal;
    an analog-to-digital converter enhancer circuit that receives from the signal analysis circuit a third signal representing a clock period of the feedforward signal; and
    a pre-distortion circuit that generates a pre-distorted baseband signal based on the parameters for input to the power amplifier.

15. The system of claim 14 further comprising a crest-factor reduction circuit that reduces a crest factor of the baseband signal and that generates the feedforward signal.

16. The system of claim 14 wherein the pre-distortion circuit generates the pre-distorted baseband signal by applying a memoryless nonlinear gain and a polynomial function to the baseband signal.

17. The system of claim 16 wherein the memoryless nonlinear gain is applied after a unit delay to the baseband signal.

18. The system of claim 16 wherein the polynomial function is based on the baseband signal and a delayed version of the baseband signal and comprises a power of a modulus of the baseband signal and a power of a modulus of the delayed version of the baseband signal.

19. The system of claim 14 further comprising an over-sampler that increases a data rate of the feedfoward signal by at least a factor of 2.

20. The system of claim 14 further comprising:
an up-converter that converts the pre-distorted baseband signal based on a timing signal to a pre-distorted signal input to the power amplifier,
wherein the downconverter converts the output signal from the power amplifier to the first signal based on the timing signal.

21. The system of claim 14 wherein the analog-to-digital converter enhancer circuit comprises:
a digital-to-analog circuit that converts the third signal from the signal analysis circuit to a first output; and
a summer that generates a second output based on the first output and the first signal from the downconverter, wherein the second output is input to the analog-to-digital converter.

22. The system of claim 14 wherein the analog-to-digital converter enhancer circuit comprises:
a first digital-to-analog circuit that converts the third signal from the signal analysis circuit to a first output;
a first summer that generates a second output based on the first output and the first signal from the downconverter;
cascaded first and second tracking-and-hold circuits operated by complementary clock signals that generate a held signal based on the second output;
a second digital-to-analog converter that converts the third signal from the signal analysis circuit to a third output; and
a second summer that generates a fourth output based on the held signal and the third output,
wherein the fourth output is input to the analog-to-digital converter.

* * * * *

UNITED STATES PATENT AND TRADEMARK OFFICE
CERTIFICATE OF CORRECTION

PATENT NO. : 9,628,120 B2
APPLICATION NO. : 14/961295
DATED : April 18, 2017
INVENTOR(S) : Qian Yu et al.

It is certified that error appears in the above-identified patent and that said Letters Patent is hereby corrected as shown below:

In the Specification

| | |
|---|---|
| Column 7, Line 27 | Delete "a is" and insert -- $\alpha$ is -- |
| Column 7, Line 31-34 | Delete "$\frac{1}{2}log\,2\,(n) = \frac{1}{2}m + \alpha$)." and insert -- $\frac{1}{2}log\,2\,(n) = \frac{1}{2}m + \alpha$ -- |
| Column 10, Line 4 | Delete "$A_r\,B_k$" and insert -- $A_k\text{-}B_k$ -- |
| Column 10, Line 17-18 | Delete "$G(m\Delta r)$" and insert -- $G(m\Delta r) = \xi_m$ -- |
| Column 10, Line 44 | Delete "SRI bus" and insert -- SPI bus -- |
| Column 12, Line 20 | Delete "101b" and insert -- 1011b -- |
| Column 12, Line 20 | Delete "$D_m$" and insert -- $D_{k,l}$ -- |
| Column 13, Line 43 | Delete "1/Q" and insert -- l/Q -- |
| Column 13, Line 56 | Delete "1011 bare" and insert -- 1011b are -- |

In the Claims

| | |
|---|---|
| Column 16, Line 18, Claim 10 | Delete "feedfoward" and insert -- feedforward -- |
| Column 17, Line 7, Claim 19 | Delete "feedfoward" and insert -- feedforward -- |

Signed and Sealed this
Seventh Day of August, 2018

Andrei Iancu
*Director of the United States Patent and Trademark Office*